United States Patent [19]
Konsevich et al.

[11] Patent Number: 5,234,348
[45] Date of Patent: Aug. 10, 1993

[54] FRONT REMOVABLE/SERVICEABLE RF BACKPLANE

[75] Inventors: Francis X. Konsevich, Everett, Wash.; Jose F. Olivas, San Diego, Calif.

[73] Assignee: TRW Inc., Redondo Beach, Calif.

[21] Appl. No.: 886,580

[22] Filed: May 21, 1992

[51] Int. Cl.⁵ .............................................. H05K 7/18
[52] U.S. Cl. ...................................... 439/61; 361/752
[58] Field of Search .................. 439/59, 60, 61, 64; 361/413, 415

[56] References Cited

U.S. PATENT DOCUMENTS

| | | | |
|---|---|---|---|
| 3,760,233 | 9/1973 | Warwick | 361/415 |
| 4,065,200 | 12/1977 | D'Angelo | 361/415 |
| 4,179,172 | 12/1979 | Godsey et al. | 439/61 |
| 4,574,332 | 3/1986 | Calabro | 361/415 |
| 4,872,212 | 10/1989 | Roos et al. | 361/415 |

Primary Examiner—Neil Abrams
Attorney, Agent, or Firm—G. Gregory Schivley; Ronald L. Taylor

[57] ABSTRACT

An RF backplane for interconnecting a plurality of electronic components. The backplane is housed in a rack which is installed in a vehicle such as an airplane. The backplane includes a fixed frame fixedly mounted in the rack and at least one removable frame aligned with and removably attached to the fixed frame. Upon removal of the removable frame and electronic components attached thereto, complete access is afforded to the backplane and various components interconnected thereto without removal of the rack from the vehicle.

20 Claims, 2 Drawing Sheets

FRONT REMOVABLE/SERVICEABLE RF BACKPLANE

FRONT REMOVABLE/SERVICEABLE RF BACKPLANE

The subject matter of the present invention was conceived under government contract number F33657-89-C-0059, Department of the Air Force.

BACKGROUND OF THE INVENTION

1. Technical Field

The present invention relates generally to electronic backplanes and, more particularly, to an RF backplane particularly suited for military avionic applications.

2. Discussion

A current trend in military avionic electronics is the two level flightline maintenance concept. This concept involves the design of an airplane's electronic components to facilitate removal and replacement of defective or dysfunctional components on the flightline. Following fault detection and isolation, affected modules, cables and backplane components are to be removed and replaced without removal of the aircraft from its flightline, thereby significantly improving aircraft flight readiness.

The vast majority of problems occurring with an airplane's electronic components involve the interconnecting RF backplane. This backplane typically extends along the back surface of an enclosure or integrated rack which is fixedly installed in the plane. The backplane provides the electrical interconnections for various electronic components housed within the rack. These components mainly include line replaceable modules (LRMs) which generally plug into the backplane from the front. However, most interconnections therebetween are provided by printed circuits and hardwired connections, often on the back surface of the backplane. This back surface of the backplane may also provide input/output (I/O) cable connections as well as rack to rack cable connections.

In this conventional configuration, the LRMs which usually slide into the rack and plug into the backplane from the front can often be fairly easily removed from the rack for repair or replacement. However, if an electrical problem originates with the backplane itself or other interconnecting components or cables, current backplane designs require removal of the entire rack from the airplane for complete access to the back surface of the backplane. This removal of the rack and replacement or repair of the backplane elements can take several hours to complete and often requires removal of the plane from its flightline. There is, therefore, a need for the capability to readily remove and replace not only defective LRMs but also backplane elements on the flightline, in support of the two level flightline maintenance concept.

SUMMARY OF THE INVENTION

The present invention provides a front removable and serviceable backplane which supports the two level flightline maintenance concept by facilitating service of the backplane and its interconnected electronic components from the front of the rack and without removal of the rack from the plane, permitting service in minutes rather than several hours. This unique backplane includes a fixed frame which is fixedly mounted within the rack and one or more removable frames accurately aligned with and fastened to the fixed frame. Various electronic components, also housed within the rack, are interconnected through both the fixed and removable frames. The fixed frame contains an aperture which allows complete access to all electronic components interconnected through the backplane upon removal of the line replaceable modules and the removable frame(s).

Additional objects, advantages and features of the present invention will become apparent from the following description and appended claims, taken in conjunction with the accompanying drawings.

DESCRIPTION OF A PREFERRED EMBODIMENT

Figure 1:
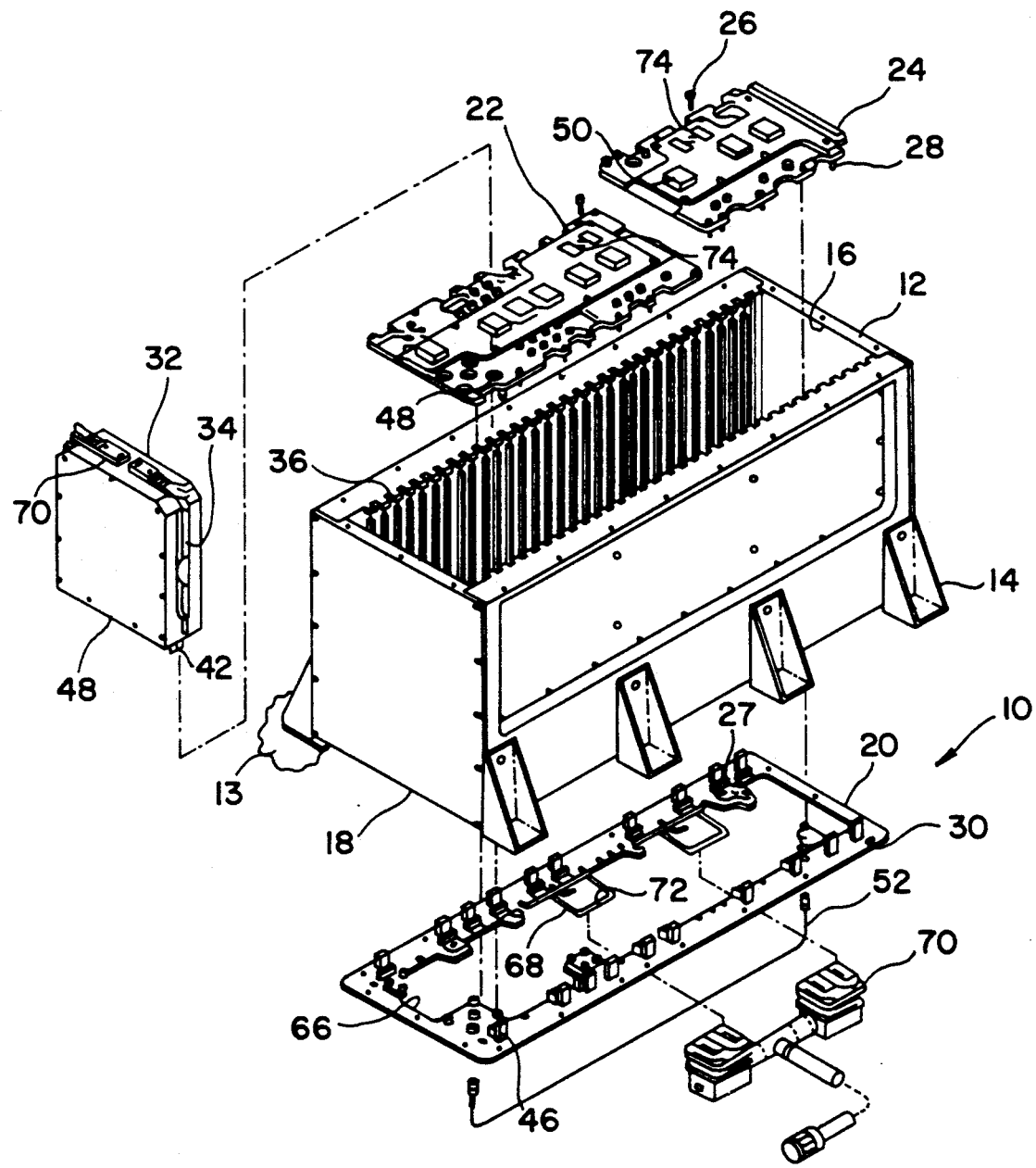
FIG. 1 is an exploded view of the front serviceable RF backplane of the present invention.

The unique backplane of the present invention is indicated generally at 10 in FIG. 1. The backplane 10 is generally housed in a chassis or rack 12 which is fixedly installed inside an airplane 13 via mounting brackets 14 or the like. Rack 12 is typically shaped as a five-sided box having an open front end 16, as well as an opposing bottom end 18. Ordinarily, an access cover (not shown) is provided to cover the front end 16 which is generally accessible from either the outside or inside of the plane upon removal of the access cover.

Figure 2:
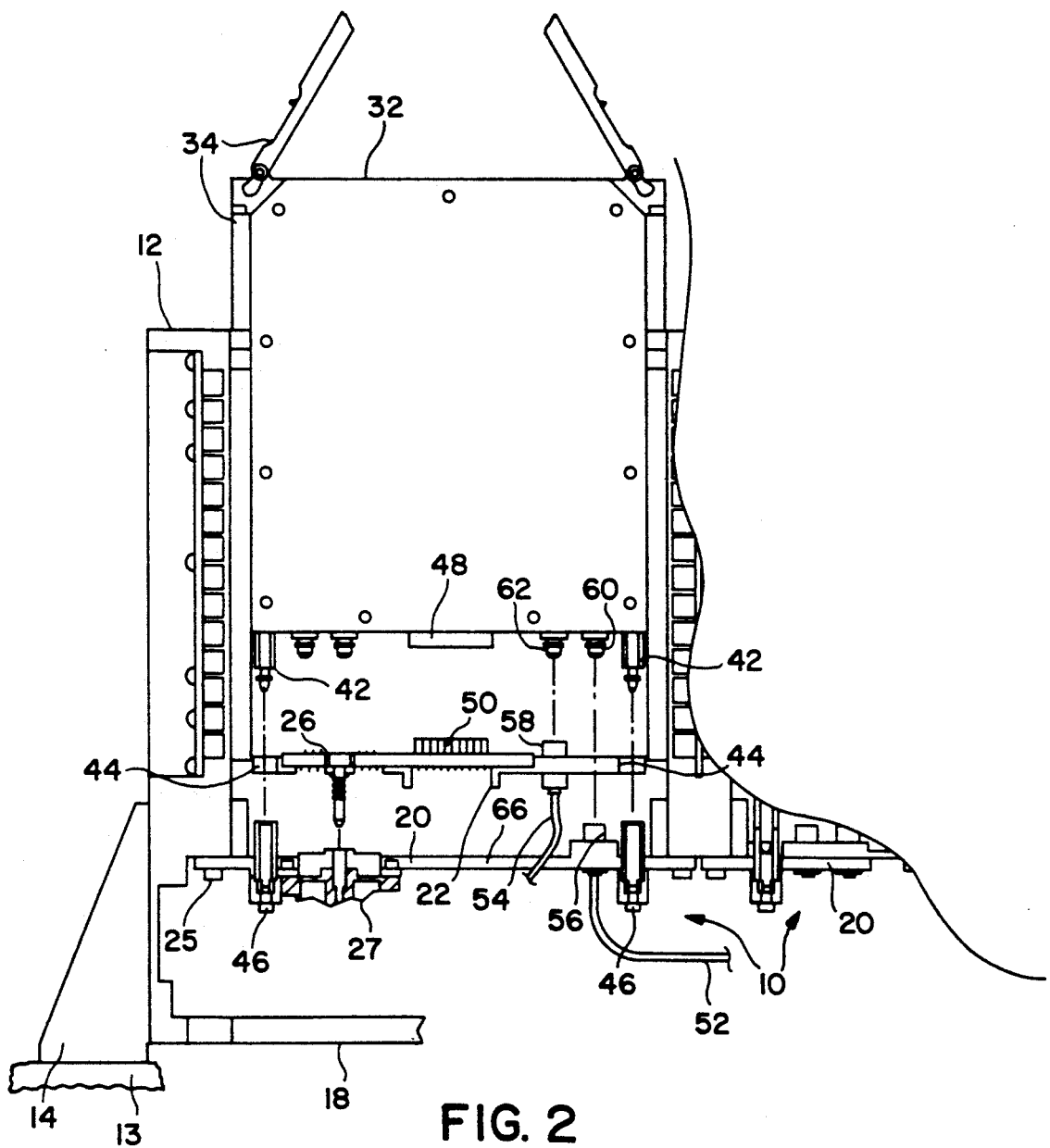
FIG. 2 is a detailed cross-sectional view illustrating LRM connection to the backplane components.

Backplane 10 generally includes a fixed frame 20 and one or more removable frames. Preferably, two coplanar removable frames 22 and 24 are provided. Fixed plane 20 is fixedly installed within rack 12 towards bottom end 18 by suitable fastening means such as cap screws 25 as shown in FIG. 2. Preferably, sufficient clearance is provided between the fixed frame 20 and the bottom end 18 of rack 12 to allow room for interconnecting cables and the like which may be housed therebetween.

Removable frames 22 and 24 are removably mounted within rack 12 and are secured atop fixed frame 20 such as by captive threaded fasteners 26. Fasteners 26 are preferably accessible from the front end 16 of rack 12 and securely mate with opposing connectors 27 in the fixed frame 20. Accurate alignment of various features on the fixed and removable frames is generally achieved through alignment pins 28 disposed on removable frames 22 and 24 which pass through accurately positioned holes 30 in the fixed frame 20. Also, as shown in FIG. 2, multiple backplanes 10, each including both fixed and removable frames, may be housed in a single rack 12 as commonly currently done with conventional backplanes.

The line replaceable modules (LRMs) 32, which typically provide high and low power digital and RF circuitry for the plane, are removably mounted within rack 12 and preferably have inserter/extractors 34 which generally extend about the periphery of each LRM 32 and are configured such that they slidably engage corresponding slots 36 in the rack 12 to provide accurate alignment therein. LRMs 32 interface with various connectors on the removable frames 22 and 24 as well as connectors and keying and alignment features on the fixed frame 20. This is shown best in FIG. 2.

Each LRM 32 preferably has a pair of keying and alignment pins 42 which pass through corresponding accurately positioned apertures 44 in the removable frame(s) to mating connectors 46 in the fixed frame 20. These connections serve to properly align the LRMs 32 upon insertion and to prevent an improper insertion. In addition, these keying and alignment connections ensure that contacts 48 on LRMs 32 are accurately aligned with corresponding multilayer printed wiring board connections 50 on the removable frames 22 and 24. The printed wiring board connections 50 are used to interconnect LRMs 32 in the same manner as currently done with conventional backplanes.

LRM interconnections are also provided via discrete RF cables 52 and 54 which are removably attached to the fixed and removable frames 20 and 22, 24, respectively. To facilitate optimum utilization of the space in rack 12, cables 52 and 54 are preferably connected to the surfaces of the fixed frame 20 and removable frames 22 and 24 opposite LRMs 32 and housed between the frames and the bottom of rack 12. These cables 52 and 54 are preferably connected to the fixed frame 20 and removable frames 22, 24 by commercially available blind mating connector assemblies 56 and 58 which allow cables 52 and 54 to snap in and which may have an accompanying suitable extraction tool used to release the cables from the connectors. This allows for easy removal of cables 52, 54 from the backplane 10 as well as easy replacement.

The keying and alignment pins 42 on LRMs 32 further ensure that RF connecting pins 60 on LRMs 32 accurately mate with RF cable connectors 56 on the fixed frame 20 to properly electrically connect LRMs 32 to RF cables 52. However, this connection must be made either through a corresponding suitable aperture in a removable frame 22 or 24 or in an area of fixed frame 20 not overlapped by a removable frame. Similarly, proper interconnection of additional RF connecting pins 62 on LRMs 32 to connectors 58 on removable frames 22 and 24 is also ensured as is proper electrical interconnection of LRMs 32 and RF cables 54.

Fixed frame 20 has a substantially sized aperture 66 formed therein. At least one bracket 68 on fixed frame 20 disposed within aperture 66 provides means for positioning and retaining a blind mating input/output (I/O) cable assembly 70 which attaches to bracket 68 such as by a series of floating threaded fasteners 72. Bracket 68 is preferably integrally formed with fixed frame member 20. I/O cable assembly 70 interfaces through bracket 68 with connectors 74 on removable frames 22, 24 to provide electrical connection to LRMs 32.

Aperture 66 in fixed frame 20 permits access to RF cables 52 attached to the back surface fixed frame 20 for servicing upon removal of LRMs 32 as well as removable frames 22 and 24. Service to defective or dysfunctional LRMs, cables, or backplane components can thus be performed from the front 16 of rack 12 without removal of rack 12 from its installed location in the airplane. Upon removal of a front access cover, the LRMs 32 are unplugged from removable frames 22 and 24 and fixed frame 20 by applying a force on LRM inserter/extractors 34 from front end 16 of rack 12. Captive fasteners 26, about the perimeters of removable frames 22 and 24, can then be loosened thus allowing removal of frames 22 and 24 from the rack to facilitate repair thereon and replacement or access to elements remaining in the rack and attached to the fixed frame 20. Aperture 66 in fixed frame 20 allows access to remaining components in rack 12 such as RF cables 52 and 54 which can be removed using a suitable extraction tool if necessary to release the snap-in RF connectors 56 and 58. Removal of I/O cable assembly 70 is permitted following the loosening of captive mounting screws 72.

All of the above described features are tailored to and collectively support front removability and serviceability of the backplane without the need to remove the rack from the vehicle in which it is installed. This unique backplane design allows convenient removal and replacement of electronic components on the flightline of an airplane without necessitating removal of the rack. The design of this backplane is such that for the removal and replacement sequence, all of the positional relationships are preserved to permit accurate LRM reinstallation. The use of captive threaded fasteners substantially eliminates problems such as loose or falling screws. Blind mating cable connectors allow connection by feel instead of sight thereby permitting connection of electrical components and cables to the back surface of the backplane without requiring removal of the rack from the plane.

The foregoing discloses and describes merely an exemplary embodiment of the present invention. One skilled in the art will readily recognize from such discussion, and from the accompanying drawings and claims, that various changes and modifications can be made therein without departing from the spirit and scope of the invention as defined in the following claims.

What is claimed is:

1. An electronic backplane for electrically interconnecting a plurality of electronic components housed within a rack having an open top for receiving electronic components inserted therein, said backplane comprising:

a first frame member having an aperture defined therein, said first frame member being fixedly mounted within said rack and said first frame member having at least one of said plurality of electronic components attachable thereto;

a second frame member aligned and removably attached atop said first frame member, said second frame member substantially overlapping said first frame member and having at least one of said plurality of electronic components attachable thereto, whereby said plurality of electronic components attached to said first frame member may be removed through said aperture in said first frame member when said second frame member has been removed from said rack; and electrical connector means mounted to at least one of said first frame member and said second frame member for electrically interconnecting said electronic components.

2. The backplane of claim 1 further comprising a third frame member removably attached and aligned atop said first frame member, said third frame member substantially overlapping said first frame member and having at least one of said plurality of electronic components attachable thereto, all of said electronic components attached to said first frame member being removable through said aperture in said first frame member when said second and third frame members have been removed from said rack.

3. The backplane of claim 2 wherein said second and third frame members are coplanar.

4. The backplane of claim 1 wherein said rack is installed in a vehicle and said plurality of components are removable from said rack without removal of said rack from the vehicle.

5. The backplane of claim 1 further comprising a pin on said second frame member and a corresponding aperture in said first frame member for aligning and positioning said second frame member with respect to said first frame member.

6. The backplane of claim 1 further comprising a captive threaded fastener for removably fastening said second frame member to said first frame member.

7. The backplane of claim 2 wherein said rack is shaped as a five-sided box with said open top being disposed toward said second and third frame members, each of said plurality of electronic components attached to said first frame member being accessible from said open top of said rack upon removal of said second and third frame members.

8. The backplane of claim 1 wherein said electrical connector means includes a multilayer printed wiring board connector disposed on said second frame member.

9. The backplane of claim 1 wherein said second frame member has at least one aperture formed therein for receiving a protruding member on one of said electronic components in order to facilitate interconnection of said electronic component and said first frame member.

10. The backplane of claim 1 wherein at least one of said electronic components is a line replaceable module.

11. The backplane of claim 10 further comprising a pin on said line replaceable module which passes through a corresponding aperture in said second frame member and mates with a mating connector on said first frame member for aligning said line replaceable module with respect to said first and second frame members.

12. The backplane of claim 11 wherein said electrical connector means includes at least one printed wiring board connector mounted to said second frame member, said printed wiring board connector being electrically interconnectable with said line replaceable module.

13. The backplane of claim 1 wherein at least one of said electronic components is an RF cable and wherein said RF cable is attachable to said first frame member by a blind mating connector.

14. The backplane of claim 13 wherein at least one of said electronic components is a line replaceable module and said module includes a connecting pin, said blind mating connector enabling electrical connection of said connecting pin to said RF cable.

15. The backplane of claim 1 wherein at least one of said electronic components is an input/output cable assembly and wherein said input/output cable assembly is removably attached to a bracket disposed within said aperture in said first frame member.

16. The backplane of claim 5 further comprising captive threaded fastening means for attaching said input/output cable assembly to said bracket.

17. The backplane of claim 10 wherein said rack includes means for slidably engaging said line replaceable modules.

18. The backplane of claim 1 wherein said electronic components include cables attached on a surface of said first frame member opposite said second frame member.

19. The backplane of claim 1 wherein said first frame member is attached about its periphery to said rack.

20. An electronic backplane for electrically interconnecting a plurality of electronic components housed within a rack, said rack being a box-like structure having an open top, said electronic components including a line replaceable module and a cable, said backplane comprising:
a first frame member having an aperture defined therein, said first frame member being fixedly mounted towards a bottom portion of said rack and lying parallel to the top of the rack;
a second frame member removably attached atop said first frame member;
means for aligning said second frame member with respect to said first frame member;
means for aligning said line replaceable module with respect to said first and second frame members, said means including a protruding member extending from bottom portions of the module through openings in the second frame member into connectors on peripheral portions of the first frame member;
a cable connector on the second frame member for removably mating the module with the cable; and
a connector on said module for engaging said cable connector when said module is fully received in said rack.

* * * * *